(12) United States Patent
Kim et al.

(10) Patent No.: US 10,664,023 B2
(45) Date of Patent: May 26, 2020

(54) INPUT MODULE WIRING STRUCTURE OF ELECTRONIC DEVICE

(71) Applicant: Samsung Electronics Co., Ltd., Suwon-si, Gyeonggi-do (KR)

(72) Inventors: Tae Sik Kim, Suwon-si (KR); Myung Jae Jo, Gumi-si (KR); Hye Won Kang, Yongin-si (KR); Ja Myeong Koo, Suwon-si (KR); Mu Jin Kim, Gumi-si (KR); Jeong Woon Koo, Daegu (KR); Dae Heon Kwon, Gumi-si (KR); Sei Neu Park, Gumi-si (KR); Won Hyun Park, Daegu (KR); Jae Young Yun, Gumi-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 33 days.

(21) Appl. No.: 15/650,723

(22) Filed: Jul. 14, 2017

(65) Prior Publication Data
US 2018/0017999 A1 Jan. 18, 2018

(30) Foreign Application Priority Data
Jul. 14, 2016 (KR) .................. 10-2016-0089111

(51) Int. Cl.
| H05K 3/46 | (2006.01) |
| H05K 3/34 | (2006.01) |
| H05K 1/18 | (2006.01) |
| H05K 1/02 | (2006.01) |
| G06F 1/18 | (2006.01) |
| G06F 1/16 | (2006.01) |
| G06F 3/044 | (2006.01) |

(52) U.S. Cl.
CPC ............ *G06F 1/183* (2013.01); *G06F 1/1601* (2013.01); *G06F 1/1626* (2013.01); *G06F 1/1658* (2013.01); *G06F 3/044* (2013.01); *H05K 1/0298* (2013.01); *H05K 1/185* (2013.01); *H05K 1/189* (2013.01); *H05K 3/3447* (2013.01); *H05K 3/4602* (2013.01); *G06F 2203/04111* (2013.01); *H05K 2201/095* (2013.01); *H05K 2201/10121* (2013.01)

(58) Field of Classification Search
CPC .... H05K 3/3347; H05K 3/4602; H05K 1/189; G06F 1/183; G06F 1/1601; G06F 1/1658
See application file for complete search history.

(56) References Cited

U.S. PATENT DOCUMENTS

| 5,956,415 A | 9/1999 | McCalley et al. |
| 8,630,096 B2 * | 1/2014 | Kim ................ H05K 3/323 |
| | | 361/749 |
| 9,030,817 B2 * | 5/2015 | Dabov .............. G06F 1/1626 |
| | | 361/679.55 |

(Continued)

FOREIGN PATENT DOCUMENTS

KR 10-1997-0059976 A 8/1997

*Primary Examiner* — Nathan Milakovich

(57) ABSTRACT

An electronic device includes a bracket having a through hole, a first circuit board and a second circuit board which are disposed below the bracket. The second circuit board is electrically connected with the first circuit board, and a first module and a second module are disposed above the bracket. The first module and the second module are electrically connected with the first circuit board via a wiring structure passing through the through hole.

16 Claims, 7 Drawing Sheets

(56) References Cited

U.S. PATENT DOCUMENTS

| | | | | |
|---|---|---|---|---|
| 9,710,019 B2* | 7/2017 | Kwon | ............... | H04B 1/3888 |
| 10,088,865 B1* | 10/2018 | Li | ................... | G06F 1/1626 |
| 2015/0245514 A1* | 8/2015 | Choung | ............ | G06K 9/00053 |
| | | | | 361/749 |
| 2016/0174395 A1* | 6/2016 | Seo | ................... | H01H 13/04 |
| | | | | 361/781 |
| 2016/0190736 A1* | 6/2016 | Chun | ............... | H01R 13/6205 |
| | | | | 439/39 |
| 2016/0234949 A1* | 8/2016 | Seo | ................... | H04M 1/0202 |
| 2017/0213068 A1* | 7/2017 | Chang | ............ | G06K 9/00053 |

* cited by examiner

INPUT MODULE WIRING STRUCTURE OF ELECTRONIC DEVICE

CROSS-REFERENCE TO RELATED APPLICATION(S)

This application claims the benefit under 35 U.S.C. § 119(a) of a Korean patent application filed on Jul. 14, 2016, in the Korean Intellectual Property Office and assigned Ser. No. 10-2016-0089111, the entire disclosure of which is hereby incorporated by reference.

TECHNICAL FIELD

Embodiments disclosed in this disclosure relate to input module wiring structures of electronic devices.

BACKGROUND

Electronic devices having a display, such as a smartphone, a wearable device, or the like, have been widely adopted. As the display of the electronic device additionally includes a touch panel, the display may be implemented as a so-called "touch screen display". The touchscreen display may perform a function as an input device that is able to receive a user manipulation, in addition to a function as a visual display device.

FIGS. 3A and 3B illustrate a conventional mounting structure of a physical button and a touch button included in an electronic device. The electronic device may include a bracket 340, a main circuit board 350m, and a sub-circuit board 350s.

A home button 311 may be disposed above the bracket 340. The home button 311 may be connected with the main circuit board 350m through a specific wiring pattern 321 passing through a through hole 345 formed in the bracket 340. Meanwhile, a touch button 321 (321a and 321b) may be arranged on the sub-circuit board 350s. Touch buttons 321a and 321b may be folded inward based on alternated long and short dash lines A and B, respectively, and may be inserted into specified holes 341a and 341b of the bracket 340, respectively. As a result, the touch buttons 321a and 321b may be disposed on a front surface of the bracket 340.

An interface terminal 353 (e.g., USB receptacle) may be arranged on the sub-circuit board 350s. Since the interface terminal 353 is frequently used by a user, the interface terminal 353 may be broken with a high probability. In the case that the interface terminal 353 itself or the sub-circuit board 350s, in which the interface terminal 353 is arranged, is to be replaced with new one as the interface terminal 353 is broken, the touch buttons 321a and 321b, which are extended from a top surface of the bracket 340 for coupling after passing through the bracket 340, have been necessarily separated from the bracket 340. This requires the separation of a display (not illustrated) disposed above the bracket 340. However, when the display is separated and coupled, the display may be broken, which results in a cost increase for customers or repair enterprises.

SUMMARY

Aspects of the present disclosure are to address at least the above-mentioned problems and/or disadvantages and to provide at least the advantages described below. Accordingly, an aspect of the present disclosure is to provide an electronic device in which a circuit configuration (e.g., FPCB) including a first module (e.g., a home button) and a second module (e.g., a touch button) is disposed between a display and a bracket and is electrically connected with a first circuit board (e.g., a main circuit board).

According to an embodiment disclosed in this disclosure, an electronic device may include a bracket in which a through hole is formed, a first circuit board and a second circuit board which are disposed below the bracket, in which the first circuit board is electrically connected with the second circuit board, and a first module and a second module which are disposed above the bracket. The first module and the second module may be electrically connected with the first circuit board via a wiring structure passing through the through hole.

According to another embodiment disclosed in this disclosure, an electronic device may include a cover glass, a display disposed below the cover glass, a bracket in which at least one opening is formed, a first PCB and a second PCB disposed below the bracket, in which the first PCB is electrically connected with the second PCB, and a rear housing disposed below the first PCB and the second PCB, and an FPCB disposed between the display and the bracket. The FPCB may include a first circuit, which receives a first user input, and a second circuit which receives a second user input. A portion of the FPCB may be electrically connected with a processor, which is mounted on the first PCB, through the at least one opening.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
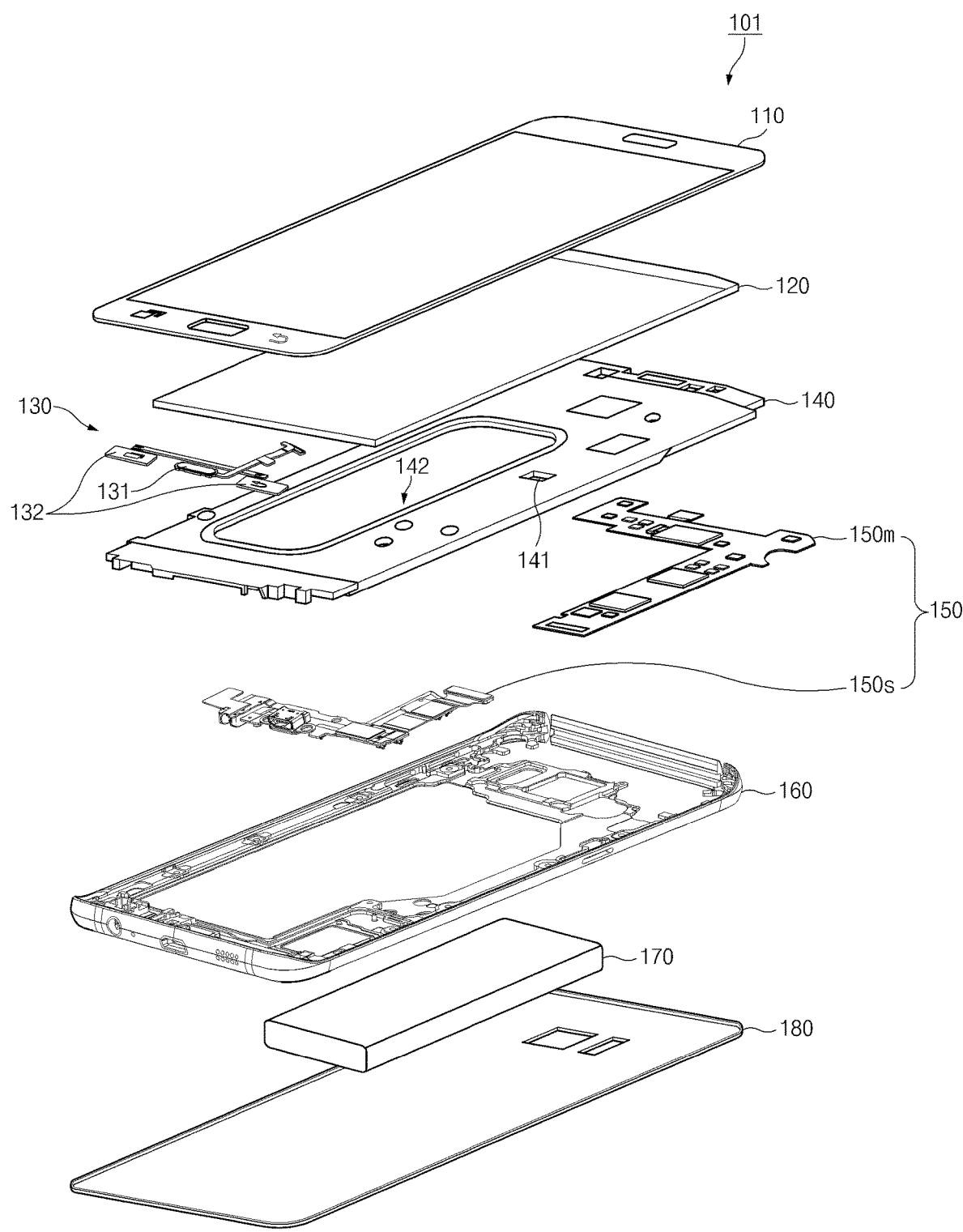
FIG. 1 is an exploded perspective view of an electronic device, according to an embodiment.

Hereinafter, various embodiments of this disclosure will be described with reference to accompanying drawings. Accordingly, those skilled in the art will recognize that modification, equivalent, and/or alternative on the various embodiments described herein can be variously made without departing from the scope and spirit of this disclosure.

With regard to the description of the drawings, similar elements may be marked by similar reference numerals.

In this disclosure, the expressions "have", "may have", "include" and "comprise", or "may include" and "may comprise" indicate existence of corresponding features (e.g., elements such as numeric values, functions, operations, or components) but do not exclude presence of additional features.

In this disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this disclosure may be used to refer to various elements regardless of the order and/or the priority and to distinguish the relevant elements from other elements, but do not limit the elements. For example, "a first user device" and "a second user device" indicate different user devices regardless of the order or the priority. For example, without departing the scope of this disclosure, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used in this disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this disclosure are used to describe specified embodiments and are not intended to limit the scope of another embodiment. The terms of a singular form may include plural forms unless otherwise specified. All the terms used herein, which include technical or scientific terms, may have the same meaning that is generally understood by those skilled in the art. It will be further understood that terms, which are defined in a dictionary and commonly used, should also be interpreted as being customary in the relevant art and not in an idealized or overly formal unless expressly so defined in various embodiments of this disclosure. In some cases, even if certain terms are defined in this disclosure, they may not be interpreted to exclude embodiments of this disclosure.

An electronic device according to various embodiments of this disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be one of the above-described devices or a combination thereof. An electronic device according to an embodiment may be a flexible electronic device. Furthermore, an electronic device according to an embodiment of this disclosure may not be limited to the above-described electronic devices and may include other electronic devices and new electronic devices according to the development of technologies.

Furthermore, an electronic device according to an embodiment of the present disclosure may not be limited to the above-described electronic devices and may include other electronic devices and new electronic devices according to the development of technologies. Hereinafter, electronic devices according to various embodiments will be described with reference to the accompanying drawings. In this disclosure, the term "user" may refer to a person who uses an electronic device or may refer to a device (e.g., an artificial intelligence electronic device) that uses the electronic device.

FIG. 1 is an exploded perspective view of an electronic device, according to an embodiment.

Referring to FIG. 1, according to an embodiment, an electronic device 101 may include a cover glass 110, a display 120, a flexible printed circuit board (FPCB) 130, a bracket 140, a circuit board 150, a rear housing 160, a battery 170, and a back cover 180. According to various embodiments, the electronic device 101 may not include some of the elements illustrated in FIG. 1, and may additionally include an element which is not illustrated in FIG. 1.

The cover glass 110 may transmit light generated from the display 110. In addition, a user may make contact with a top of the cover glass 110 by a portion (e.g., a finger) of a body to make a touch (including a contact through an electronic pen). The cover glass 110 may be formed of, for example, tempered glass, reinforced plastic, a flexible polymer material, or the like and may protect the display 120 and elements included in the electronic device 101 from external impact. According to various embodiments, the cover glass 110 may be also referred to as a "glass window".

The display 120 may be disposed below the cover glass 110 or may be coupled to the cover glass 110. The display 110 may output content (e.g., a text, an image, a video, an icon, a widget, a symbol, or the like) or may receive a touch input (including a touch, a gesture, a hovering, and a "force touch") from a user. To this end, the display 120 may include, for example, a display panel, a touch panel, and/or a pressure sensor. A thin film, a sheet, or a plate, which is formed of copper (Cu) or graphite, may be disposed on the rear surface of the display 120.

According to one embodiment, the display panel of the display 120 may include, for example, a liquid crystal display (LCD) panel, a light emitting diode (LED) display panel, an organic LED (OLED) display panel, a microelectromechanical systems (MEMS) display panel, or an electronic paper display panel. For example, the touch panel included in the display 120 may include a capacitive touch panel, a pressure sensitive touch panel, a resistive touch panel, an infrared touch panel, or an ultrasonic touch panel.

The FPCB 130 may be disposed above the bracket 140. In other words, the FPCB 130 may be disposed between the display 120 and the bracket 140. According to various embodiments of this disclosure, the FPCB 130 may include a first module 131, a second module 132, and a wiring structure for the electrical connection between the first and second modules 131 and 132 and the circuit board 150. According to an embodiment, at least one portion of the wiring structure may be implemented on the FPCB 130.

Regarding the first module 131 and the second module 132, the term "module" used in this disclosure may represent, for example, a unit including one or more combinations of hardware, software or firmware. The term "module" may be interchangeably used with the terms "unit", "logic", "logical block", "component" and "circuit". The "module" may be a minimum unit of an integrated component or may be a portion thereof. The "module" may be a minimum unit for performing one or more functions or a portion thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

In this disclosure, for the convenience of explanation, the first module 131 will be described as a physical key (or a physical button) including a first circuit which is to receive a first user input (e.g., a physical pressure, or the like). In addition, the second module 132 will be described as a touch key (or a touch button) including a second circuit which is to receive a second user input (e.g., "touch", "force touch", or the like). The first module 131 and the second module 132 are not limited thereto. For example, the first module 131 and the second module 132 may include at least one of various sensors, which are disposed on a front surface (the arrangement surface of the display 120) of the electronic device 101, an input button, an input device, a camera, or various elements illustrated in FIGS. 4 and 5.

The configuration of the FPCB 130 will be described in more detail later with reference to FIGS. 2A and 2B.

For example, the bracket 140, which is formed of a magnesium (Mg) alloy, may be disposed below the display device 120 and the FPCB 130 and over the circuit board 150. The bracket 140 may be coupled to the display device 120 and the circuit board 150 to physically support the display device 420 and the circuit board 150. According to an embodiment, the bracket 140 may have a through hole 141 formed therein such that a portion of the FPCB 130 passes through the through hole 141. In addition, according to an embodiment, a swelling gap 142 may be formed in the bracket 130 in consideration of swelling of the battery 170 due to aged deterioration. According to various embodiments, the through hole 141 may be referred to as various terms of "via hole", "opening", "opening part" or the like.

The circuit board 150 may include, for example, a first circuit board (or a main circuit board 150m) and a second circuit board (or a sub-circuit board 150s). According to an embodiment, the first circuit board 150m and the second circuit board 150s may be disposed below the bracket 140 and may be electrically connected with each other through a specified connector or a specified wiring. The first and second circuit boards 150m and 150s may be, for example, implemented with rigid printed circuit boards (rigid PCBs). According to an embodiment, various electronic elements, devices, PCBs, or the like (e.g., elements of FIGS. 4 and 5) may be mounted or arranged at the first and second circuit boards 150m and 150s. According to various embodiments, the first and second circuit boards 150m and 150s may be referred to as "main board", "printed board assembly (RBA)" or briefly "PCB".

The rear housing 160 may be disposed below the circuit board 150 to receive elements of the electronic device 101. Regarding the appearance of the electronic device 101, the rear housing 160 may form an inner appearance and/or an outer appearance of the electronic device 101. The rear housing 160 may be referred to as "rear case" or "rear plate". The rear housing 160 may include an area not exposed out of the electronic device 101 and an area exposed to an outer side surface of the electronic device 101. For example, the area not exposed out of the electronic device 101 may include a plastic injection product. The area exposed to the outer side surface of the electronic device 101 may be formed of metal. The area exposed to the outer side surface and formed of metal may be referred to as "metal bezel". According to an embodiment, at least a portion of the metal bezel may be utilized as an antenna radiator to transceive a signal having a specified frequency.

The battery 170 may convert chemical energy to electrical energy or electrical energy to chemical energy. For example, the battery 170 may convert chemical energy to electrical energy and may supply the electrical energy to various elements or modules mounted in the display device 120 and on the circuit board 150. In addition, the battery 170 may convert electrical energy, which is supplied from the outside, to chemical energy and may store the chemical energy therein. According to an embodiment, the circuit board 150 may include a power management module to manage charging/discharging of the battery 170.

A back cover 180 may be coupled to a rear surface of the electronic device 101 (that is, a bottom of the rear housing 160). The back cover 180 may be formed of tempered glass, a plastic injection product, and/or metal. According to various embodiments, the back cover 180 may be implemented integrally with the rear housing 160 or may be implemented detachably from the rear housing 160 by a user.

Figure 2A:
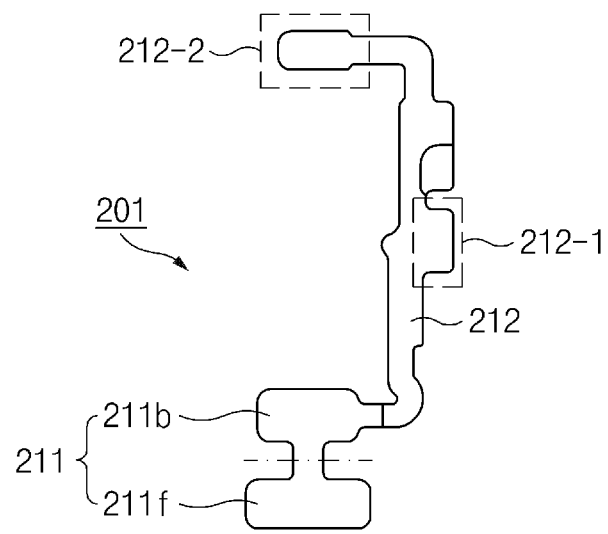
FIGS. 2A and 2B are views illustrating an FPCB, according to an embodiment.
Figure 2B:
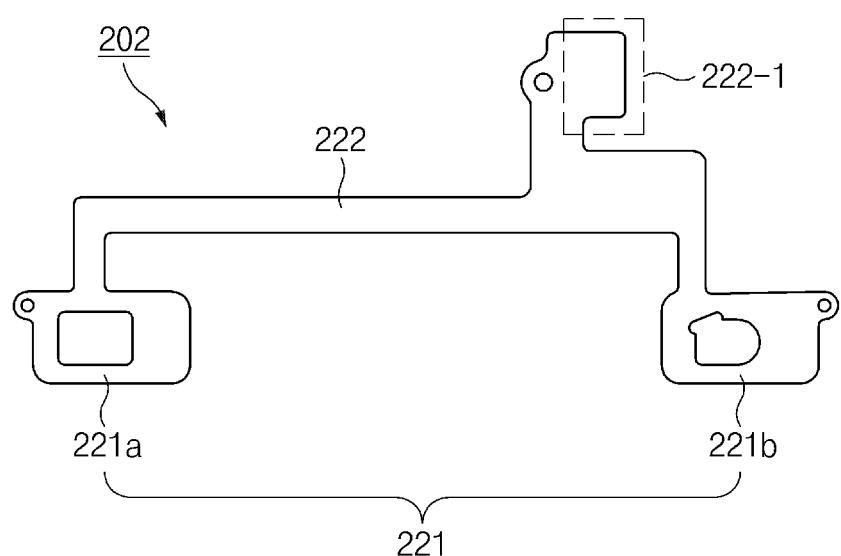

FIGS. 2A and 2B are views illustrating an FPCB, according to an embodiment.

A first FPCB 201 and a second FPCB 202 may constitute the FPCB 130 illustrated in FIG. 1. It will be understood to those skilled in the art that the first FPCB 201 and the second FPCB 202 may include the first module 131 and the second module 132 illustrated in FIG. 1, respectively.

The first FPCB 201 may include a first module 211 and a first wiring associated with the first module 211. For example, the first module 211 may include a key or a button (is referred to as a physical key or a physical button, respectively) which generates an input signal based on physical pressure. For example, the first module 211 may include a home key or a home button, which is to call or display a home screen under an operating system, in terms of functions. In other words, the first module 211 may include a physical button 211b configured to call and display the home screen. The physical button 211b may include a dome-shaped member provided on the rear surface thereof. A circuit (first circuit) included in the physical button 211b may generate a specific input signal in response to pressure applied to the physical button 211b.

In addition, according to an embodiment, the first module 211 may include a fingerprint sensor 211f which detects a fingerprint of a user to generate fingerprint data. In other words, the fingerprint sensor 211f may detect the fingerprint data on the fingerprint of a finger of the user. For example, the fingerprint image of the finger may be captured by the fingerprint sensor 211f, and the captured fingerprint image may be used, for example, for user authentication. For example, the fingerprint sensor 211f may employ an area manner or a swipe manner of recognizing a fingerprint in an area unit.

According to an embodiment, the fingerprint sensor 211f is folded about an alternated long and short dash line illustrated between the physical button 211b and the fingerprint sensor 211f and may be disposed above the physical button 211b as if the fingerprint sensor 211f covers the physical button 211b. In addition, a plastic structure and/or a relevant circuit element may be inserted, for example, between the physical button 211b and the fingerprint sensor 211f. An outer surface of the fingerprint sensor 211f may be uniformly printed or may be coupled to another member. Accordingly, the first module 211 including the physical button 211b and the fingerprint sensor 211f may be configured in a single module or in an assembly form.

According to an embodiment, the first wiring associated with the first module 211 may be implemented on the first FPCB 201. Although the first wiring may not be illustrated in detail in FIGS. 2A and 2B, the first wiring may be implemented in the form of a printed circuit in at least a portion 212 of the first FPCB 201.

For example, the first wiring may provide an electrical path for transceiving a signal, data, or power between the first module 211 and a processor (not illustrated). For example, the first wiring is formed in the at least portion 212 of the first FPCB 201 to electrically connect the first module 211 with the processor (not illustrated). For example, the first wiring may include a wiring for transmitting an input signal generated from the first module 211 to the processor (not illustrated) mounted on the first circuit board (e.g., 150m of FIG. 1), a wiring for transmitting fingerprint data generated from the fingerprint sensor 211f included in the first module 211 to the processor, and/or a wiring for supplying power to the fingerprint sensor 211f. To this end, the wiring, which is formed at one end point 212-2 of the FPCB 201, of the first wiring may be electrically connected with the first circuit board on which the processor is mounted.

The second FPCB 202 may include a second module 221 and a second wiring associated with the second module 221. For example, the second module 221 may include a key or a button which generates an input signal based on the variation in at least one of a capacitance, a resistance, or a voltage (the second module 221 may be referred to as a touch key or a touch button). For example, the second module 221 may include at least one of "Back key", "Menu key" or "Recent key" in terms of functions. That is, the second module 221 may include a touch button allocated with a function of "Back key", "Menu key", or "Recent key". In addition, according to various embodiments, the second module may include a light source. For example, the light source may include an optical waveguide, an LED, and the like. Meanwhile, the second module 221 may include a touch button 221a allocated with a function of "Recent key" and a touch button 221b allocated with a function of "Back key".

In addition, according to an embodiment, the second module 221 may further include a pressure sensor (may be referred to as "force sensor") which detects (touch) pressure applied to the second module 221. For example, the pressure sensor may include two electrodes and a dielectric layer disposed between the electrodes and may detect touch pressure based on the capacitance between the electrodes.

According to an embodiment, the second wiring associated with the second module 221 may be implemented on the second FPCB 202. Although the second wiring may not be illustrated in detail, the second wiring may be implemented in the form of a printed circuit on at least a portion 222 of the second FPCB 202.

For example, the second wiring may provide an electrical path for transceiving a signal, data, or power between the second module 221 (e.g., the Recent-key touch button 221a or the Back-key touch button 221b) and a processor (not illustrated). For example, the second wiring may be formed on the at least portion 222 of the second FPCB 202 to electrically (indirectly) connect the second module 221 with the processor (not illustrated). For example, the second wiring may include a wiring for transmitting an input signal generated from the second module 221 to the first circuit board (e.g., 150m of FIG. 1) and a wiring for supplying power to a light source included in the second module 221. In this case, the second wiring may be connected with the first wiring at one or more points, thereby electrically connecting the second module 221 with the processor (not illustrated).

In this content, according to an embodiment, a portion of the first wiring arranged at a specified area 212-1 of the portion 212 of the first FPCB 201 may be coupled to a portion of the second wiring arranged at a specified area 222-1 of the portion 222 of the second FPCB 202. For example, the portion of the first wiring may be connected with the portion of the second wiring through an anisotropic conductive film (ACF) bonding treatment of physically and electrically coupling the wirings to each other by applying heat and pressure to an adhesive including fine conductive particles (e.g., nickel (Ni), a solder ball, or the like) or a treatment of "Hot-Bar" by using pulse-heated soldering machine.

Figure 2C:
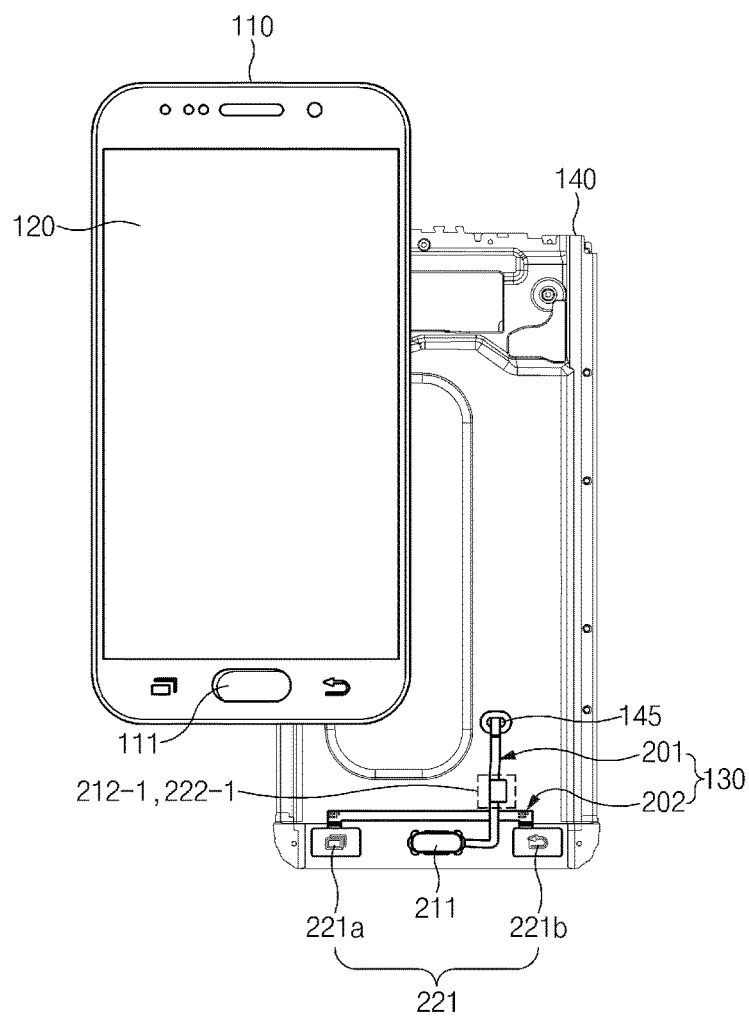
FIGS. 2C and 2D are views illustrating the mounting of an FPCB in an electronic device, according to an embodiment.
Figure 2D:
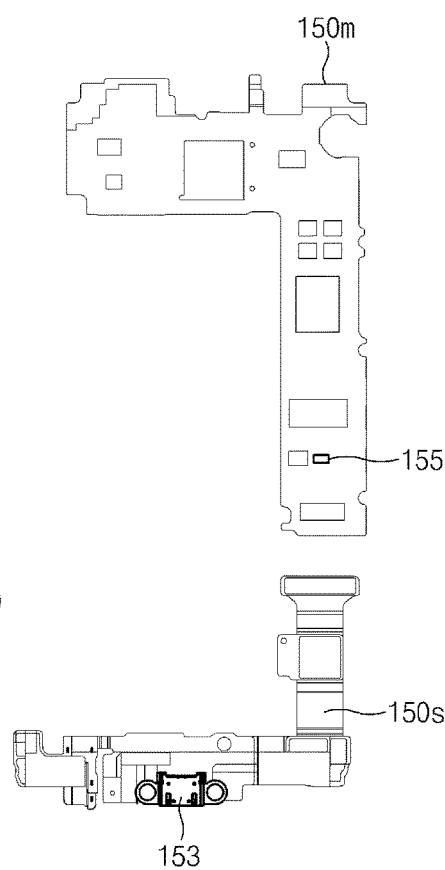

FIGS. 2C and 2D are views illustrating the mounting of the FPCB according to one embodiment.

According to an embodiment, the FPCB 130 may be disposed between the assembly of the cover glass 110 and the display 120, and the bracket 140. The first circuit board 150m and the second circuit board 150s may be disposed below the bracket 140 (below an opposite surface to a surface on which the display 120 and the FPCB 130 are disposed). In the following description, the same reference numerals will be assigned to the same elements as those of FIGS. 1 and 2A-2B, and the details of the same elements assigned with the same reference numerals may be omitted.

The processor (not illustrated) may be arranged on the first circuit board 150m. The processor may process a signal or data transmitted to the first module 211 and/or the second module 221 or a signal or data received from the first module 211 and/or the second module 221. To this end, the first circuit board 150m may include a conductive patch 155 for electrical connection with the FPCB 130 (e.g., the first FPCB 201) including the first module 211 and the second module 221.

An input/output interface 153 may be arranged on the second circuit board 150s to transmit or receive at least one of data, a signal, or power to or from an external device. For example, the input/output interface 153 may include at least one of a universal serial bus (USB) connector or an audio connector (e.g., 3.5 mm audio jack). Since the second circuit board 150s is not directly connected with the FPCB 130 disposed on the bracket 140, the second circuit board 150s may be independently separable in a direction opposite to a direction of making contact with (facing) the bracket 140 (that is, separable from the rear surface of the electronic device).

The FPCB 130 may include the first FPCB 201 and the second FPCB 202. Accordingly, the FPCB 130 may include the first module 211, the second module 212, and the wiring structure for the first and second modules 211 and 212. As illustrated in FIG. 2B, the first module 211 may be, for example, exposed to an exterior of the electronic device (i.e., the outside) through a hole 111 formed in a portion of the cover glass 110, which is not coupled to the display 120. In addition, for example, the second module 221 may be disposed below the portion of the cover glass 110, which is not coupled to the display 120.

The wiring structure may include, for example, a first wiring which electrically connects the first module 211 with the first circuit board 150m, and a second wiring which electrically (indirectly) connects the second module 221 with the first circuit board 150m. According to an embodiment, the first wiring may be formed in the first FPCB 201, and the second wiring may be formed in the second FPCB 202.

According to an embodiment, the first module 211 and the second module 221 may be electrically connected with the first circuit board 150m via the wiring structure passing through the through hole 145 formed in the bracket 140. In other words, a portion of the FPCB 130 may be electrically connected with the processor arranged on the first circuit board 150m through the through hole (or an opening) 145 formed in the bracket 140.

For example, a portion one point 212-2 illustrated in FIG. 2A) of the wiring structure formed in the first FPCB 201 may be electrically coupled to the conductive patch 155 included in the first circuit board 150m through the through hole 145 formed in the bracket 140, thereby connecting the first module 211 and the second module 221 with the first circuit board 150m.

According to an embodiment, the second wiring may branch from one point of the first wiring to connect the second module 221 to the first circuit board 150m. For example, the portion of the first wiring arranged at the specified area 212-1 of the first FPCB 201 may be electrically coupled to the portion of the second wiring arranged at the specified area 222-1 of the second FPCB 202. For example, the portion of the first wiring and the portion of the second wiring may be electrically connected with each other through the ACF bonding treatment or the treatment of "Hot-Bar".

Alternatively, the first wiring and the second wiring may be implemented on a single FPCB from an initial stage. In other words, the first FPCB 201 and the second FPCB 202 may be implemented in the form of a single FPCB. Accordingly, in this case, the ACF boding treatment or the treatment of "Hot-Bar" is unnecessary. In addition, according to various embodiments, the second wiring may be directly connected with the conductive patch 155 of the first conductive substrate 150m instead of branching from the first wiring.

Figure 2E:
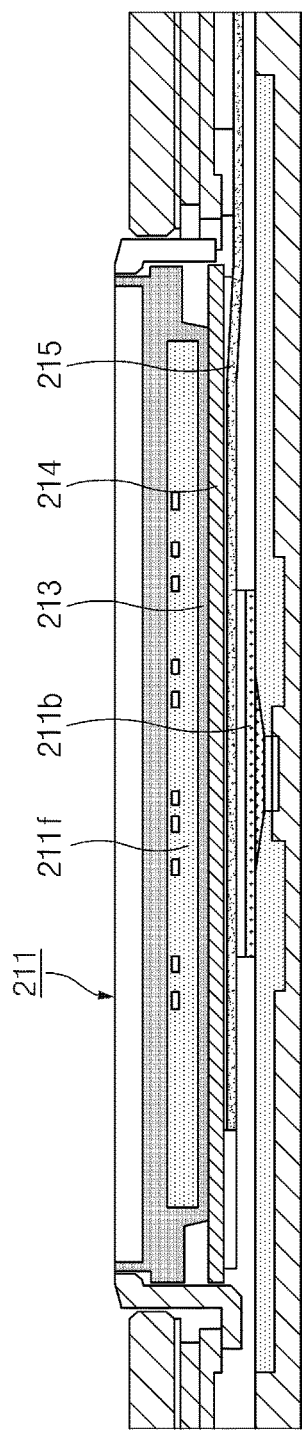
FIG. 2E is a sectional view illustrating a first module, according to an embodiment.
Figures 3A, 3B:
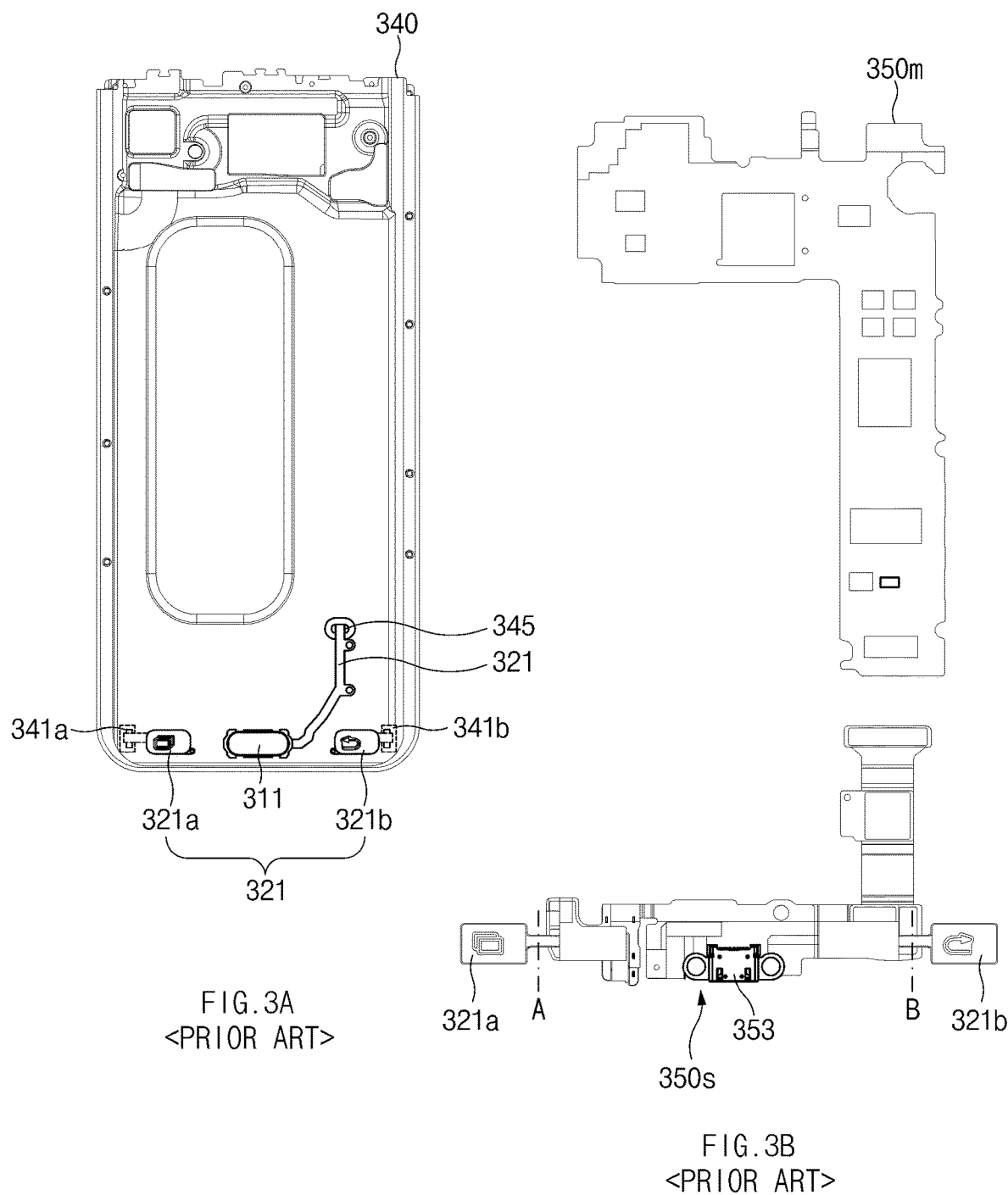
FIGS. 3A and 3B are views illustrating a conventional mounting structure of a physical button and a touch button included in a typical electronic device.

FIG. 2E is a sectional view illustrating a first module, according to an embodiment.

FIG. 2E illustrates a sectional view of the first module 211, according to an embodiment. For example, the first module 211 may be exposed to the outside together with the cover glass 110 like the first module 131 illustrated in FIG. 1.

According to an embodiment, the first module 211 may include the physical button (or a home key) 211b, which generates an input signal based on physical pressure, and the fingerprint sensor 211f which detects fingerprint data. In addition, an FPCB 215 including a wiring for transmitting the input signal, which is generated from the physical button 211b, to the first circuit board and an FPCB 213 including a wiring associated with a touch IC and/or relevant wiring for driving or controlling the fingerprint sensor 211f may be disposed between the physical button 211b and the fingerprint sensor 211f. For example, the FPCB 215 may correspond to a portion of the first FPCB 201 illustrated in FIG. 2A, and the FPCB 213 may correspond to a portion of the second FPCB 202 illustrated in FIG. 2B. A SUS layer 214, which is obtained by punching a metal scrap and then by performing heat fusion with respect to the result, may be disposed between the FPCB 215 and the FPCB 213.

According to various embodiments, the FPCB including the first module (e.g., a home button) and the second module (e.g., a touch module) may be disposed between the display and the bracket and may be electrically connected with the first circuit board (e.g., a main circuit board). Accordingly, in the case that the second circuit board (e.g., a sub-circuit board) itself or an input/output interface disposed on the second circuit board is replaced with new one, the second circuit board or the input/output interface may be sufficiently replaced with new one through the access to the rear surface of the electronic device. Accordingly, it is unnecessary to separate the display disposed on the front surface of the electronic device.

As described above, according to an embodiment, an electronic device may include a bracket in which a through hole is formed, a first circuit board and a second circuit board which are disposed below the bracket, in which the second circuit board is electrically connected with the first circuit board, and a first module and a second module which are disposed above the bracket. The first module and the second module may be electrically connected with the first circuit board via a wiring structure passing through the through hole.

According to another embodiment, at least a portion of the wiring structure may be implemented with a flexible printed circuit board (FPCB).

According to another embodiment, the wiring structure may include a first wiring which electrically connects the first module with the first circuit board and a second wiring which electrically connects the second module with the first circuit board.

According to another embodiment, the first module may include a key generating an input signal based on physical pressure and a fingerprint sensor detecting fingerprint data, and the first wiring may include at least one of a wiring for transmitting the input signal to the first circuit board, a wiring for transmitting the fingerprint data to the first circuit board, or a wiring for supplying power to the fingerprint sensor.

According to another embodiment, the second module may include a key, which generates an input signal based on a variation in at least one of a capacitance, a resistance, or a voltage, and a light source, and the second wiring may include at least one of a wiring for transmitting the input signal to the first circuit board or a wiring for supplying power to the light source.

According to another embodiment, the second wiring may branch from one point of the first wiring and may be coupled to the second module.

According to another embodiment, the first wiring and the second wiring may be electrically connected with each other through an anisotropic conductive film (ACF) bonding treatment or a Hot-Bar treatment.

According to another embodiment, the first wiring and the second wiring may be implemented on a single FPCB.

According to another embodiment, a processor may be arranged on the first circuit board to process a signal or data transmitted to or received from the first module and the second module.

According to another embodiment, an input/output interface may be arranged on the second circuit board to transmit or receive at least one of data, a signal, or power to or from an external device.

According to another embodiment, the input/output interface may include at least one of a universal serial bus (USB) connector or an audio connector.

According to another embodiment, the first module may include a key or a button which generates an input signal based on physical pressure.

According to another embodiment, the first module may include a home key or a home button.

According to another embodiment, the first module may include a fingerprint sensor which detects fingerprint data.

According to another embodiment, the second module may include a key or a button which generates an input signal based on a variation in at least one of a capacitance, a resistance, or a voltage.

According to another embodiment, the second module may include a pressure sensor which detects pressure applied to the second module.

According to another embodiment, the second module includes at least one of "Back key", "Menu key", or "Recent key".

According to another embodiment, the electronic device may further include a display disposed above the bracket and a cover glass coupled to a top of the display. The second module may be disposed below a portion, which is not coupled to the display, of the cover glass, and the first module may be exposed to an outside through a hole formed in the portion, which is not coupled to the display, of the cover glass.

According to another embodiment, the second circuit board may be individually separable in a direction opposite to a direction of making contact with (facing) the bracket.

Further, according to an embodiment, an electronic device may include a cover glass, a display disposed below the cover glass, a bracket in which at least one opening is formed, a first printed circuit board (PCB) and a second PCB disposed below the bracket, the second PCB being electrically connected with the first PCB, and a rear housing disposed below the first PCB and the second PCB, and a flexible printed circuit board (FPCB) disposed between the display and the bracket. The FPCB may include a first circuit which receives a first user input and a second circuit which receives a second user input. A portion of the FCB may be electrically connected with a processor mounted on the first PCB through the at least one opening.

Figure 4:
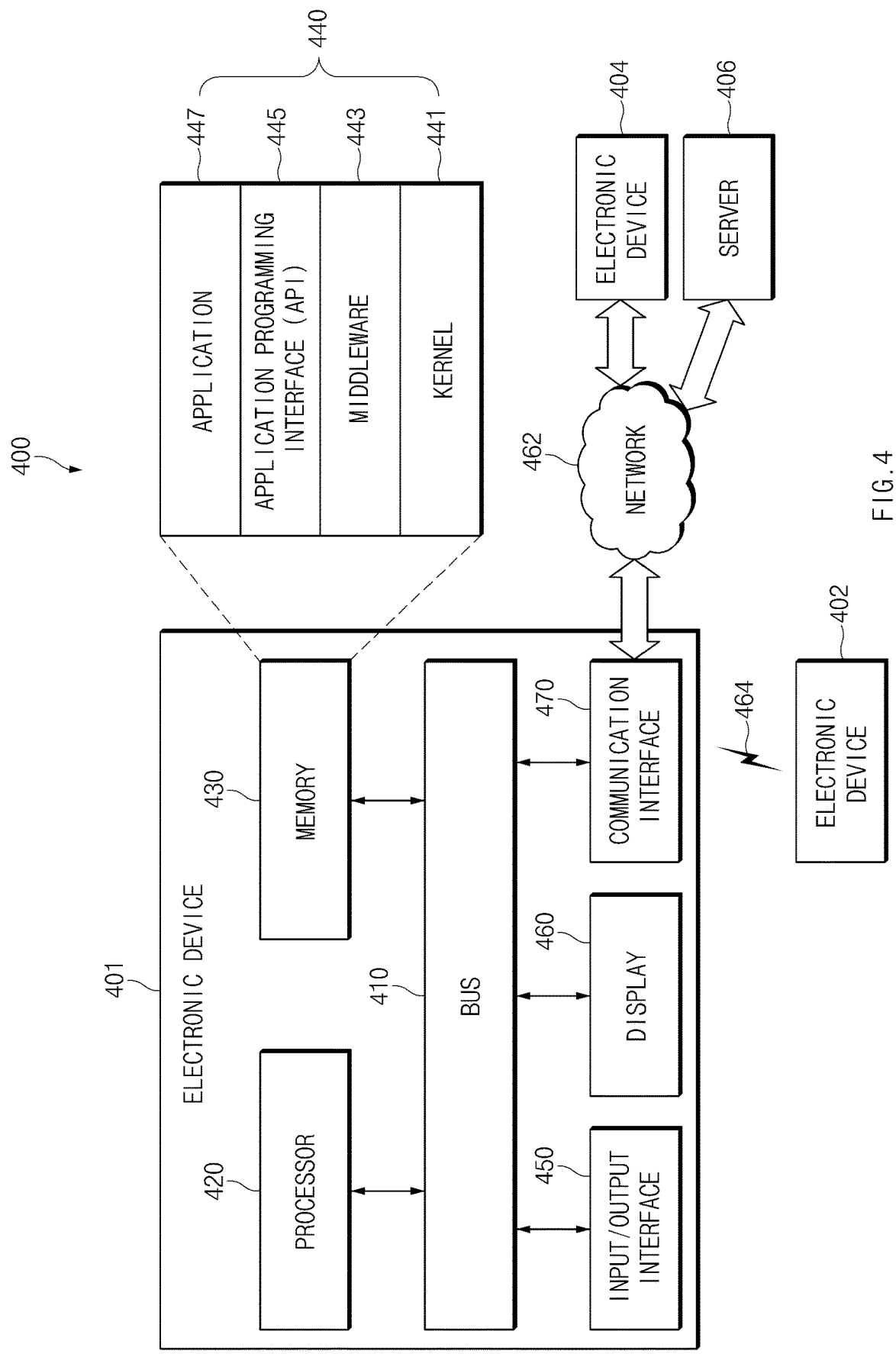
FIG. 4 illustrates a block diagram of an electronic device in a network environment, according to various embodiments.

FIG. 4 illustrates a block diagram of an electronic device in a network environment, according to various embodiments.

Referring to FIG. 4, according to various embodiments, an electronic device 401, 402, or 404 or a server 406 may be connected with each other over a network 462 or a short range communication 464. The electronic device 401 may include a bus 410, a processor 420, a memory 430, an input/output interface 450, a display 460, and a communication interface 470. According to an embodiment, the electronic device 401 may not include at least one of the above-described elements or may further include other element(s).

For example, the bus 410 may interconnect the above-described elements 410 to 470 and may include a circuit for conveying communications a control message and/or data) among the above-described elements.

The processor 420 may include one or more of a central processing unit (CPU), an application processor (AP), or a communication processor (CP). For example, the processor 420 may perform an arithmetic operation or data processing associated with control and/or communication of at least one other element(s) of the electronic device 401.

The memory 430 may include a volatile and/or nonvolatile memory. For example, the memory 430 may store instructions or data associated with at least one other element(s) of the electronic device 401. According to an embodiment, the memory 430 may store software and/or a program 440. The program 440 may include, for example, a kernel 441, a middleware 443, an application programming interface (API) 445, and/or an application program (or "an application") 447. At least a part of the kernel 441, the middleware 443, or the API 445 may be referred to as an "operating system (OS)".

For example, the kernel 441 may control or manage system resources (e.g., the bus 410, the processor 420, the memory 430, and the like) that are used to execute operations or functions of other programs (e.g., the middleware 443, the API 445, and the application program 447). Furthermore, the kernel 441 may provide an interface that allows the middleware 443, the API 445, or the application program 447 to access discrete elements of the electronic device 401 so as to control or manage system resources.

The middleware 443 may perform, for example, a mediation role such that the API 445 or the application program 447 communicates with the kernel 441 to exchange data.

Furthermore, the middleware 443 may process one or more task requests received from the application program 447 according to a priority. For example, the middleware 443 may assign the priority, which makes it possible to use a system resource (e.g., the bus 410, the processor 420, the memory 430, or the like) of the electronic device 401, to at least one of the application program 447. For example, the middleware 443 may process the one or more task requests according to the priority assigned to the at least one, which makes it possible to perform scheduling or load balancing on the one or more task requests.

The API 445 may be, for example, an interface through which the application program 447 controls a function provided by the kernel 441 or the middleware 443, and may include, for example, at least one interface or function (e.g., an instruction) for a file control, a window control, image processing, a character control, or the like.

The input/output interface 450 may play a role, for example, of an interface which transmits an instruction or data input from a user or another external device, to another element(s) of the electronic device 401. Furthermore, the input/output interface 450 may output an instruction or data, received from another element(s) of the electronic device 401, to a user or another external device.

The display 460 may include, for example, a liquid crystal display (LCD), a light-emitting diode (LED) display, an organic LED (OLED) display, a microelectromechanical systems (MEMS) display, or an electronic paper display. The display 460 may display, for example, various contents (e.g., a text, an image, a video, an icon, a symbol, and the like) to a user. The display 460 may include a touch screen and may receive, for example, a touch, gesture, proximity, or hovering input using an electronic pen or a part of a user's body.

For example, the communication interface 470 may establish communication between the electronic device 401 and an external device (e.g., the first external electronic device 402, the second external electronic device 404, or the server 406). For example, the communication interface 470 may be connected to the network 462 over wireless communication or wired communication to communicate with the external device (e.g., the second external electronic device 404 or the server 406).

The wireless communication may include cellular communication employing at least one of, for example, long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like, as cellular communication protocol. According to an embodiment, the wireless communication may include, for example, at least one of wireless fidelity (Wi-Fi), Bluetooth, near field communication (NFC), magnetic stripe transmission (MST), radio frequency (RF), a body area network (BAN), and a global navigation satellite system (GNSS).

The MST may generate a pulse in response to transmission data using an electromagnetic signal, and the pulse may generate a magnetic field signal. The electronic device 401 may transfer the magnetic field signal to point of sale (POS), and the POS may detect the magnetic field signal using a MST reader. The POS may recover the data by converting the detected magnetic field signal to an electrical signal.

The GNSS may include at least one of, for example, a global positioning system (GPS), a global navigation satellite system (Glonass), a Beidou navigation satellite system (Beidou), or a European global satellite-based navigation system (Galileo) based on an available region, a bandwidth, or the like. Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), a plain old telephone service (POTS), or the like. The network 462 may include at least one of telecommunications networks, for example, a computer network (e.g., LAN or WAN), an Internet, or a telephone network.

Each of the first and second external electronic devices 402 and 404 may be a device of which the type is different from or the same as that of the electronic device 401. According to an embodiment, the server 406 may include a group of one or more servers. According to various embodiments, all or a portion of operations performed in the electronic device 401 may be executed by another or plural electronic devices (e.g., the electronic devices 402 and 404 or the server 406). According to an embodiment, in the case where the electronic device 401 executes any function or service automatically or in response to a request, the electronic device 401 may not perform the function or the service internally, but, alternatively additionally, it may request at least a portion of a function associated with the electronic device 401 at another device (e.g., the electronic device 402 or 404 or the server 406). The other electronic device (e.g., the electronic device 402 or 404 or the server 406) may execute the requested function or additional function and may transmit the execution result to the electronic device 401. The electronic device 401 may provide the requested function or service using the received result or may additionally process the received result to provide the requested function or service. To this end, for example, cloud computing, distributed computing, or client-server computing may be used.

Figure 5:
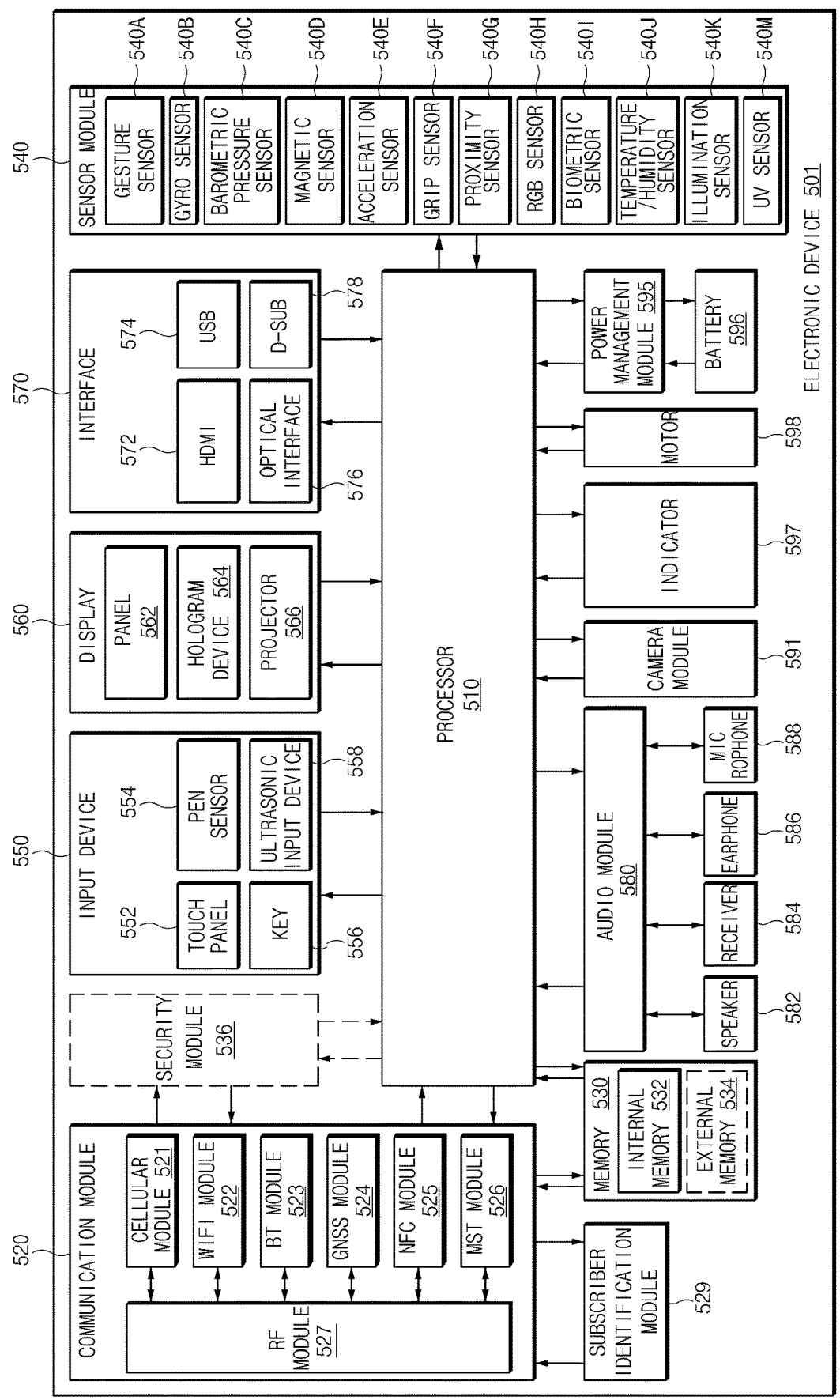
FIG. 5 illustrates a block diagram of an electronic device, according to various embodiments.

FIG. 5 illustrates a block diagram of an electronic device, according to various embodiments.

Referring to FIG. 5, an electronic device 501 may include, for example, an entire part or a part of the electronic device 401 illustrated in FIG. 4. The electronic device 501 may include one or more processors (e.g., an application processor; AP) 510, a communication module 520, a subscriber identification module 529, a memory 530, a sensor module 540, an input device 550, a display 560, an interface 570, an audio module 580, a camera module 591, a power management module 595, a battery 596, an indicator 597, and a motor 598.

The processor 510 may operate, for example, an operating system (OS) or an application to control a plurality of hardware or software elements connected to the processor 510 and may process and compute a variety of data. For example, the processor 510 may be implemented with a System on Chip (SoC). According to an embodiment, the processor 510 may further include a graphic processing unit (GPU) and/or an image signal processor. The processor 510 may include at least a part (e.g., a cellular module 521) of elements illustrated in FIG. 5. The processor 510 may load an instruction or data, which is received from at least one of other elements (e.g., a nonvolatile memory), into a volatile memory and process the loaded instruction or data. The processor 510 may store a variety of data in the nonvolatile memory.

The communication module 520 may be configured the same as or similar to the communication interface 470 of FIG. 4. The communication module 520 may include the cellular module 521, a Wi-Fi module 522, a Bluetooth (BT) module 523, a GNSS module 524 (e.g., a GPS module, a Glonass module, a Beidou module, or a Galileo module), a near field communication (NFC) module 525, a MST module 526, and a radio frequency (RF) module 527.

The cellular module 521 may provide, for example, voice communication, video communication, a character service, an Internet service, or the like over a communication network. According to an embodiment, the cellular module 521 may perform discrimination and authentication of the electronic device 501 within a communication network by using the subscriber identification module (e.g., a SIM card) 529. According to an embodiment, the cellular module 521 may perform at least a portion of functions that the processor 510 provides. According to an embodiment, the cellular module 521 may include a communication processor (CP).

Each of the Wi-Fi module 522, the BT module 523, the GNSS module 524, the NFC module 525, or the MST module 526 may include a processor for processing data exchanged through a corresponding module, for example. According to an embodiment, at least a part (e.g., two or more) of the cellular module 521, the Wi-Fi module 522, the BT module 523, the GNSS module 524, the NEC module 525, or the MST module 526 may be included within one integrated Circuit (IC) or an IC package.

For example, the RF module 527 may transmit and receive a communication signal (e.g., an RF signal). For example, the RF module 527 may include a transceiver, a power amplifier module (PAM), a frequency filter, a low noise amplifier (LNA), an antenna, or the like. According to another embodiment, at least one of the cellular module 521, the Wi-Fi module 522, the BT module 523, the GNSS module 524, the NEC module 525, or the MST module 526 may transmit and receive an RF signal through a separate RF module.

The subscriber identification module 529 may include, for example, a card and/or embedded SIM that includes a subscriber identification module and may include unique identifying information (e.g., integrated circuit card identifier (ICCID)) or subscriber information (e.g., international mobile subscriber identity (IMSI)).

The memory 530 (e.g., the memory 430) may include an internal memory 532 or an external memory 534. For example, the internal memory 532 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory), or the like), a hard drive, or a solid state drive (SSD).

The external memory 534 may further include a flash drive such as compact flash (CF), secure digital (SD), micro secure digital (Micro-SD), mini secure digital (Mini-SD), extreme digital (xD), a multimedia card (MMC), a memory stick, or the like. The external memory 534 may be operatively and/or physically connected to the electronic device 501 through various interfaces.

A security module 536 may be a module that includes a storage space of which a security level is higher than that of the memory 530 and may be a circuit that guarantees safe data storage and a protected execution environment. The security module 536 may be implemented with a separate circuit and may include a separate processor. For example, the security module 536 may be in a smart chip or a secure digital (SD) card, which is removable, or may include an embedded secure element (eSE) embedded in a fixed chip of the electronic device 501. Furthermore, the security module 536 may operate based on an operating system (OS) that is different from the OS of the electronic device 501. For example, the security module 536 may operate based on java card open platform (JCOP) OS.

The sensor module 540 may measure, for example, a physical quantity or may detect an operation state of the electronic device 501. The sensor module 540 may convert the measured or detected information to an electric signal. For example, the sensor module 540 may include at least one of a gesture sensor 540A, a gyro sensor 540B, a barometric pressure sensor 540C, a magnetic sensor 540D, an acceleration sensor 540E, a grip sensor 540F, the proximity sensor 540G, a color sensor 540H (e.g., red, green, blue (RGB) sensor), a biometric sensor 540I, a temperature/humidity sensor 540J, an illuminance sensor 540K, or an UV sensor 540M. Although not illustrated, additionally or generally, the sensor module 540 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 540 may further include a control circuit for controlling at least one or more sensors included therein. According to an embodiment, the electronic device 501 may further include a processor that is a part of the processor 510 or independent of the processor 510 and is configured to control the sensor module 540. The processor may control the sensor module 540 while the processor 510 remains at a sleep state.

The input device 550 may include, for example, a touch panel 552, a (digital) pen sensor 554, a key 556, or an ultrasonic input unit 558. For example, the touch panel 552 may use at least one of capacitive, resistive, infrared and ultrasonic detecting methods. Also, the touch panel 552 may further include a control circuit. The touch panel 552 may further include a tactile layer to provide a tactile reaction to a user.

The (digital) pen sensor 554 may be, for example, a part of a touch panel or may include an additional sheet for recognition. The key 556 may include, for example, a physical button, an optical key, or a keypad. The ultrasonic input device 558 may detect (or sense) an ultrasonic signal, which is generated from an input device, through a microphone (e.g., a microphone 588) and may check data corresponding to the detected ultrasonic signal.

The display 560 (e.g., the display 460) may include a panel 562, a hologram device 564, or a projector 566. The panel 562 may be the same as or similar to the display 460 illustrated in FIG. 4. The panel 562 may be implemented, for example, to be flexible, transparent or wearable. The panel 562 and the touch panel 552 may be integrated into a single module. The hologram device 564 may display a stereoscopic image in a space using a light interference phenomenon. The projector 566 may project light onto a screen so as to display an image. For example, the screen may be arranged in the inside or the outside of the electronic device 501. According to an embodiment, the panel 562 may include a pressure sensor (or force sensor) that measures the intensity of touch pressure by a user. The pressure sensor may be implemented integrally with the touch panel 552, or may be implemented as at least one sensor separately from the touch panel 552. According to an embodiment, the display 560 may further include a control circuit for controlling the panel 562, the hologram device 564, or the projector 566.

The interface 570 may include, for example, a high-definition multimedia interface (HDMI) 572, a universal serial bus (USB) 574, an optical interface 576, or a D-subminiature (D-sub) 578. The interface 570 may be included, for example, in the communication interface 470 illustrated in FIG. 4. Additionally or generally, the interface 570 may include, for example, a mobile high definition link (MHL) interface, a SD card/multi-media card (MMC) interface, or an infrared data association (IrDA) standard interface.

The audio module 580 may convert a sound and an electric signal in dual directions. At least a part of the audio module 580 may be included, for example, in the input/output interface 450 illustrated in FIG. 4. The audio module 580 may process, for example, sound information that is input or output through a speaker 582, a receiver 584, an earphone 586, or the microphone 588.

For example, the camera module 591 may shoot a still image or a video. According to an embodiment, the camera module 591 may include at least one or more image sensors (e.g., a front sensor or a rear sensor), a lens, an image signal processor (ISP), or a flash (e.g., an LED or a xenon lamp).

The power management module 595 may manage, for example, power of the electronic device 501. According to an embodiment, a power management integrated circuit (PMIC), a charger IC, or a battery or fuel gauge may be included in the power management module 595. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 596 and a voltage, current or temperature thereof while the battery is charged. The battery 596 may include, for example, a rechargeable battery and/or a solar battery.

The indicator 597 may display a specified state of the electronic device 501 or a part thereof (e.g., the processor 510), such as a booting state, a message state, a charging state, and the like. The motor 598 may convert an electrical signal into a mechanical vibration and may generate the following effects: vibration, haptic, and the like. Although not illustrated, a processing device (e.g., a GPU) for supporting a mobile TV may be included in the electronic device 501. The processing device for supporting the mobile TV may process media data according to the standards of digital multimedia broadcasting (DMB), digital video broadcasting (DVB), MediaFlo™, or the like.

Each of the above-mentioned elements of the electronic device according to various embodiments described in this disclosure may be configured with one or more components, and the names of the elements may be changed according to the type of the electronic device. In various embodiments, the electronic device may include at least one of the above-mentioned elements, and some elements may be omitted or other additional elements may be added. Furthermore, some of the elements of the electronic device according to various embodiments may be combined with each other so as to form one entity, so that the functions of the elements may be performed in the same manner as before the combination.

According to embodiments disclosed in this disclosure, the FPCB including the first module (e.g., the home button) and the second button (e.g., the touch module) may be disposed between the display and the bracket, and may be electrically connected with the first circuit board (e.g., the main circuit board). Accordingly, in the case that the second circuit board (e.g., a sub-circuit board) itself or the input/output interface disposed on the second circuit board is replaced with new one, the second circuit board or the input/output interface may be sufficiently replaced with new one through the access to the rear surface of the electronic device. Therefore, it is unnecessary to separate the display disposed in the front surface of the electronic device. In addition, various effects may be directly or indirectly produced through this disclosure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a bracket in which a through hole is formed;
    a display disposed above the bracket;
    a first circuit board disposed below the bracket and including a processor;
    a second circuit board disposed below the bracket, wherein the second circuit board is electrically connected with the first circuit board;
    a first module disposed between the bracket and the display;
    a second module disposed between the bracket and the display; and
    a wiring structure extending from each of the first module and the second module through the through hole to the first circuit board, wherein the wiring structure includes:
        a first portion extending from the first module,
        a second portion extending from the second module, and
        a third portion connected to the first portion and the second portion, and extending through the through hole to the first circuit board,
    wherein the wiring structure includes a flexible printed circuit board (FPCB), and
    wherein the FPCB includes:
        a first FPCB including the first portion and the third portion of the wiring structure; and
        a second FPCB including the second portion of the wiring structure, wherein the second FPCB is branched from the first FPCB so that each of the first portion and the second portion of the wiring structure is electrically connected to the third portion of the wiring structure.

2. The electronic device of claim 1, wherein the first module includes a key configured to generate an input signal based on physical pressure, and a fingerprint sensor configured to detect fingerprint data, and
    wherein the first portion of the wiring structure includes at least one of:
        a wiring for transmitting the input signal to the first circuit board;
        a wiring for transmitting the fingerprint data to the first circuit board; or
        a wiring for supplying power to the fingerprint sensor.

3. The electronic device of claim 1, wherein the second module includes a light source and a key configured to generate an input signal based on a variation in at least one of a capacitance, a resistance, or a voltage,
    wherein the second portion of the wiring structure includes at least one of:
        a wiring for transmitting the input signal to the first circuit board; or
        a wiring for supplying power to the light source.

4. The electronic device of claim 1, wherein the first portion of the wiring structure and the second portion of the wiring structure are electrically connected with each other through an anisotropic conductive film (ACF) bonding treatment or a Hot-Bar treatment.

5. The electronic device of claim 1, wherein the first portion of the wiring structure and the second portion of the wiring structure include a single flexible printed circuit board (FPCB).

6. The electronic device of claim 1, wherein the processor is configured to process a signal or data transmitted to or received from the first module and the second module.

7. The electronic device of claim 1, wherein an input/output interface is arranged on the second circuit board to transmit or receive at least one of data, a signal, or power to or from an external device.

8. The electronic device of claim 7, wherein the input/output interface includes at least one of a universal serial bus (USB) connector or an audio connector.

9. The electronic device of claim 1, wherein the first module includes a key or a button configured to generate an input signal based on physical pressure.

10. The electronic device of claim 1, wherein the first module includes a home key or a home button.

11. The electronic device of claim 1, wherein the first module includes a fingerprint sensor configured to detect fingerprint data.

12. The electronic device of claim 1, wherein the second module includes a key or a button configured to generate an input signal based on a variation in at least one of a capacitance, a resistance, or a voltage.

13. The electronic device of claim 1, wherein the second module includes a pressure sensor configured to detect pressure applied to the second module.

14. The electronic device of claim 1, wherein the second module includes at least one of a Back key, a Menu key, or a Recent key.

15. The electronic device of claim 1, wherein the display comprises a cover glass forming a surface of the electronic device, and a display panel including a light emitting element, and wherein the cover glass includes an active area displayed by the display panel and an inactive area at a periphery of the active area.

16. The electronic device of claim 1, wherein the second circuit board is individually separable in a direction opposite to a direction of facing the bracket.

* * * * *